(12) United States Patent
Lazzari

(10) Patent No.: US 9,423,421 B2
(45) Date of Patent: Aug. 23, 2016

(54) TESTING HEAD FOR A TEST EQUIPMENT OF ELECTRONIC DEVICES

(75) Inventor: Stefano Lazzari, Cernusco Lombardone (IT)

(73) Assignee: Technoprobe S.p.A., Cernusco Lombardone (IT)

( * ) Notice: Subject to any disclaimer, the term of this patent is extended or adjusted under 35 U.S.C. 154(b) by 1149 days.

(21) Appl. No.: 13/441,757

(22) Filed: Apr. 6, 2012

(65) Prior Publication Data

US 2012/0280702 A1 Nov. 8, 2012

(30) Foreign Application Priority Data

Apr. 12, 2011 (IT) .............................. MI2011A0615

(51) Int. Cl.
| | | |
|---|---|---|
| *G01R 31/20* | (2006.01) | |
| *G01R 1/067* | (2006.01) | |
| *G01R 1/073* | (2006.01) | |

(52) U.S. Cl.
CPC ........ *G01R 1/06716* (2013.01); *G01R 1/07357* (2013.01)

(58) Field of Classification Search
CPC .............. G01R 1/06738; G01R 27/14; G01R 31/2801; G01R 31/2891; G01R 31/2881
USPC .................. 324/750.19, 755.11, 762.01, 500, 324/750.25, 600, 750.15–750.18, 750.29, 324/754.01, 754.03, 756.01, 513, 522, 324/758.01, 76, 2.01, 695; 438/14–18; 257/48; 439/482, 824, 342, 259–270

See application file for complete search history.

(56) References Cited

U.S. PATENT DOCUMENTS

| | | | |
|---|---|---|---|
| 2001/0028255 A1* | 10/2001 | Endo .................. | G01R 1/07357 324/750.19 |
| 2005/0270044 A1* | 12/2005 | Crippa ............... | G01R 1/06738 324/755.11 |
| 2008/0100326 A1 | 5/2008 | Chen et al. | |

FOREIGN PATENT DOCUMENTS

| | | | |
|---|---|---|---|
| EP | 1243931 | A1 | 9/2002 |
| EP | 2088443 | A1 | 8/2009 |
| EP | 2107380 | A1 | 10/2009 |

* cited by examiner

*Primary Examiner* — Tung X Nguyen
*Assistant Examiner* — Trung Nguyen
(74) *Attorney, Agent, or Firm* — Seed IP Law Group PLLC

(57) ABSTRACT

A testing head for a test equipment of electronic devices of the type includes a plurality of contact probes inserted into guide holes which are realized in at least an upper guide and a lower guide separated one another by an air zone. Each of such contact probes include at least a probe body having a substantially rectangular section and a projecting arm from the probe body which ends with a probe tip for contacting one of a plurality of contact pads of a device to be tested. The projecting arm projects outside the probe body so as to have a lug with respect to both faces of the probe body which converge in an edge in order to define a probe tip offset and external with respect to the probe body.

33 Claims, 6 Drawing Sheets

TESTING HEAD FOR A TEST EQUIPMENT OF ELECTRONIC DEVICES

BACKGROUND

1. Technical Field

The present disclosure relates to a testing head for a test equipment of electronic devices.

In particular but not exclusively, the disclosure relates to a testing head for a test equipment of electronic devices integrated on a wafer and the following description is made with reference to this field of application only for simplifying the description thereof.

2. Description of the Related Art

As is known, a testing head is a device able to put a plurality of contact pads of a microstructure, in particular an electronic device integrated on a wafer, into electrical connection with corresponding channels of a testing machine that performs the functionality check thereof, in particular an electrical check, or generically the testing.

The test run on integrated devices serves, in particular, for detecting and insulating faulty devices yet in the production step. Normally, testing heads are therefore used for the electrical testing of the devices integrated on a wafer before cutting and assembling the same within a package for containing chips.

A testing head comprises a plurality of mobile contact elements or contact probes retained by at least one pair of plates or guides substantially plate-shaped and parallel to one another. Such guides are provided with suitable holes and placed at a certain distance from each other so as to leave a free zone or air zone for the movement and any deformation of the contact probes. The pair of guides, in particular, comprises an upper guide and a lower guide, both provided with guide holes within which the contact probes, normally formed by wires of special alloys with good electrical and mechanical properties, axially slide.

The proper connection between the testing probes and the contact pads of the device being tested is ensured by the pressure of the testing head onto the device itself, the contact probes, mobile within the guide holes made into the upper and lower guides, undergoing a bending upon such pressing contact, within the air zone between the two guides and a sliding within such guide holes. Testing heads of this type are commonly called "vertical probes".

The contact probes have, in particular, a contact tip that abuts onto corresponding contact pads of a device to be tested, performing the mechanical and electrical contact between said device and a test equipment whereof this testing head forms an end element. Usually, the contact probes have a further contact tip (also called contact head) towards a plurality of contact pads of a micro contact structure, also called space transformer.

A testing head of this type is schematically shown in FIG. 1, globally indicated with 1. The testing head 1 comprises at least one upper guide [upper die] 2 and one lower guide [lower die] 3, having respective upper 4 and lower 5 through guide holes wherein at least one contact probe 6 is slidingly engaged.

The contact probe 6 has a contact end or tip 7. In particular, the contact tip 7 is in mechanical contact with a contact pad 8 of a device 9 to be tested, while performing the electrical contact between said device 9 and a test equipment (not shown) whereof such testing head constitutes an end element.

The upper 2 and lower 3 guides are suitably spaced apart by an air zone ZA which allows the deformation or inclination of the contact probes 6 during the normal operation of the testing head, i.e. when such testing head contacts the device to be tested. Moreover, the upper 4 and lower 5 guide holes are sized so as to guide the contact probe 6.

FIG. 1 schematically shows a testing head 1 with non locked probes associated to a micro contact structure or space transformer, schematically indicated with 9A.

In this case, the contact probes 6 have a further contact tip 7A towards a plurality of contact pads 8A of the space transformer 9A, the good electrical contact between probes 6 and space transformer 9A being ensured similarly to the contact with the device to be tested by the pressure of the probes 6 on the contact pads 8A of the space transformer 9A.

A critical parameter in making a testing head is the distance (the so-called pitch) between the centers of the contact pads provided on the device to be tested. The pitch of integrated electronic devices, in fact, with the advancement of the corresponding manufacturing technologies, has become increasingly smaller, forcing to a high packing of the contact probes in the testing head, and causing positioning problems when one wants to avoid the mutual contact between the probes.

A distribution of contact pads on two sides is for example schematically shown in FIG. 2A. In the most recent technologies, the distance between the centers of the contact pads on the device to be tested, i.e. the pitch P indicated in the figure, has decreased down to values in the range between 30 μm and 80 μm. This reduction in the pitch mostly affects pad configurations on four sides, as shown in FIG. 2B. In this case, the distances between the contact centers of pads on a same row or on a same column, still called pitches and indicated in the figure as P1 and P2, respectively, have decreased down to values in the range between 30 μm and 80 μm.

The same problems, even bigger, are found in the testing of devices having pad configurations on four sides and multiple rows, as schematically shown in FIG. 2C.

Moreover, it should be noted that the testing may also involve multiple devices in parallel, as shown in FIG. 2D, the devices being separated from each other by so-called scribe lines SL, the thickness whereof, always lowering, complicates the testing operations of the pads of devices in parallel facing such scribe lines SL.

As already said, the decreasing the pitch value of the configurations of contact pads of newer devices to be tested, as well as the need of testing multiple devices in parallel introduces problems tied to the contact between adjacent probes.

In the case of contact probes of the type shown in FIG. 1, it is immediate to see that the minimum pitch substantially depends on the dimensions of the same probes 6. In the current vertical technologies, normally with probes having a circular cross-section, a reduction of the pitch value is thus obtained by reducing the diameter of the probes 6.

It is also known, for example from the European patent No. EP 1 243 931 granted on Jul. 17, 2004 to the Applicant, to offset the contact between the probe tip and the corresponding pads with respect to a longitudinal axis of the same probes so as to reduce the minimum pitch value.

In particular, the contact probes are provided with a stiff arm laterally projecting and extending in a direction being perpendicular or sloping by a suitable angle with respect to the probe. In other words, the stiff arm has a longitudinal axis which is perpendicular or sloped with respect to the longitudinal axis of the respective probe.

As schematically shown in FIG. 3B in a top view, a contact probe 15 comprises a stiff arm 12 laterally projecting from a body 11 of the probe 15 and ending with a contact tip 13 for contact pads 14 of a device to be tested.

As described in the patent No. EP 1 243 931 as above indicated, the offset between the longitudinal axis of the probes and the respective contact tips along with a suitable probe orientation allow the same probes to be placed in an alternatively opposed position, with respect to the contact pads, thereby considerably increasing the space available for the probe bodies, with a consequent remarkable reduction of the risks of a contact also for very small pitches, as schematically shown in FIG. 3A for a testing head 10 comprising a plurality of contact probes 15 of the type shown in FIG. 3B.

FIG. 4A shows an arrangement of the contact probes 15 particularly suitable for the case of contact pads 14 arranged on all the four sides of the device to be tested.

In particular, the adjacent probes 15 are arranged in an alternatively opposed position with respect to the contact pads 14 with symmetry axes which slope with respect to an alignment axis of the contact pads 14, forming a predetermined angle with this axis, in one preferred embodiment equal to 45°.

In the case shown, the contact probes 15 further have a projecting arm 12 arranged in offset position with respect to the probe body 11. In this case, left probes 15$sx$ are those having an arm placed against a left side of the probe body 11 and right probes 15$dx$ are those having an arm placed against a right side of the probe body 11, as shown in FIG. 4B.

The relative terms "right" and "left" are usual in the field and in the present description are used in relation to a local reference system of the figures.

In a preferred embodiment described in the above-indicated patent, the contact probes 15 have a non-circular cross-section, in particular a rectangular one. In this case, also the corresponding guide holes have a rectangular cross-section and the probes 15 inserted therein are always properly positioned with respect to the contact pads 14 of the device to be tested.

As indicated in the description text of the patent No. EP 1 243 931 in re, the probes with a rectangular cross-section, as shown by way of an example in FIGS. 3A, 3B, 4A and 4B, allow a further reduction of the used space when compared to the probes with a circular section and thereby a further reduction of the minimum pitch value.

In this case, the probe orientation and the exact position of the contact tip 13 on the contact pad 14 is ensured by the precise orientation of the guide hole having a rectangular cross-section that does not allow a rotation of probe 15 also having a rectangular section and being inserted therein.

While being advantageous from several viewpoints, the known solutions as those described in the European patent No. EP 1 243 931 as above indicated in any case have a limitation imposed by the overall dimensions of the probe body for the minimum pitch of the contact pads of the devices to be tested, especially in the case of a parallel testing and a testing of devices having pads on multiple rows.

BRIEF SUMMARY OF THE DISCLOSURE

An embodiment of the disclosure is directed toward a testing head provided with a plurality of contact probes for the connection to a test equipment of electronic devices, in particular integrated on a wafer, having such structural and functional features as to allow overcoming the limits and the drawbacks that still afflict the testing heads made according to the prior art, in particular avoiding the contact between adjacent probes, also in case of a high packing of the contact probes for very close configurations of contact pads, that is, having a very little pitch and arranged on all the sides of the device to be tested.

The testing head comprises contact probes having projecting arms capable of offsetting the contact point with respect to a body of such probes, such projecting arms being further arranged so as to have an exceeding lateral size with respect to the probe body in substantial extension of a diagonal of the rectangular section of the probe body.

According to an aspect of the disclosure, a testing head for a test equipment of electronic devices comprises:
an upper guide and a lower guide being separated one another by an air zone and provided with respective guide holes; and
a plurality of contact probes being inserted into the guide holes, each of the contact probes in turn including:
 a probe body having a substantially rectangular section defined by a first pair of faces parallel to each other and a second pair of faces parallel to each other, each face of the first pair being perpendicular to the faces of the second pair;
 a projecting arm from the probe body;
 a probe tip as an ending portion of the projecting arm for contacting one of a plurality of contact pads of a device to be tested
wherein the projecting arm projects outside the probe body so as to have:
 a lug with respect to the first and second pair of faces of the probe body, and
 a tip defined by two perpendicular faces converging in an edge of the section of the probe body and being the probe tip,
 the probe tip being offset and external with respect to the probe body.

According to another aspect of the disclosure, a testing head for a test equipment of electronic devices comprises:
an upper guide and a lower guide being separated one another by an air zone and provided with respective guide holes; and
a plurality of contact probes being inserted into the guide holes, each of the contact probes in turn including comprising at least a probe body having a substantially rectangular section and a projecting arm from the probe body which ends with a probe tip for contacting one of a plurality of contact pads of a device to be tested
wherein the projecting arm projects outside the probe body so as to have a lug with respect to both faces of said probe body, which faces converging in an edge, and
the contact probes are disposed in alternatively opposed positions with respect to an alignment axis of the contact pads of the device to be tested, the contact probes having symmetry axes which slope with respect to the alignment axis.

According to a further aspect of the disclosure, a testing head for a test equipment of electronic devices comprises:
an upper guide and a lower guide being separated one another by an air zone and provided with respective guide holes; and
a plurality of contact probes being inserted into the guide holes, each of the contact probes in turn including comprising at least a probe body having a substantially rectangular section and a projecting arm from the probe body which ends with a probe tip for contacting one of a plurality of contact pads of a device to be tested
wherein the projecting arm projects outside the probe body so as to have a lug with respect to both faces of said probe body, which faces converging in an edge, and
the contact probes are disposed in alternatively opposed positions with respect to an alignment axis of the contact pads of the device to be tested, the contact probes having symmetry axes which slope with respect to the alignment axis
 contact probes, which are opposed with respect to the alignment axis of the contact pads and in contact with consecutive pads, have projecting arms being disposed diametrically opposed with respect to the alignment axis, and contact probes, which are adjacent in a same half-plane being defined by the alignment axis, have projecting arms being disposed in corresponding positions with respect to the alignment axis.

Finally, according to yet another aspect of the disclosure, a test equipment of electronic devices comprises:

a testing head having an upper guide and a lower guide being separated one another by an air zone and provided with respective guide holes; and a plurality of contact probes being inserted into the guide holes a device to be tested comprising a plurality of contact pads each of the contact probes in turn including comprising at least a probe body having a substantially rectangular section and a projecting arm from the probe body which ends with a probe tip for contacting one of a plurality of contact pads of the device to be tested wherein the projecting arm of each contact probe projects outside the respective probe body so as to have a lug with respect to both faces of said probe body, which faces converging in an edge defining a probe tip being offset and external with respect to the probe body.

The features and the advantages of the testing head according to the disclosure will appear more clearly from the following description of an embodiment thereof, made by way of an indicative non-limiting example with reference to the annexed drawings.

DETAILED DESCRIPTION

Figure 1:
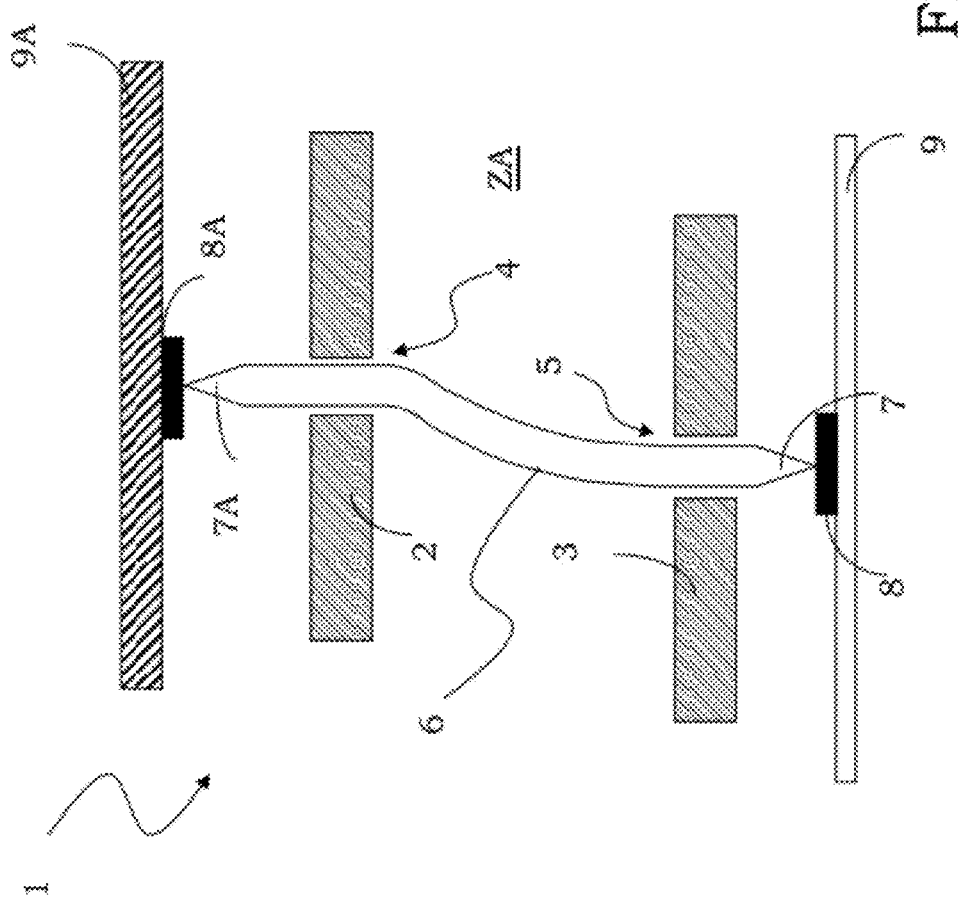
FIG. 1 schematically shows an embodiment of a testing head according to the prior art.
Figure 2B:
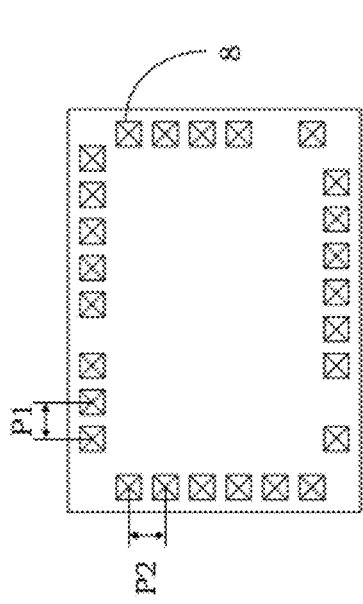
FIGS. 2A-2D schematically show configurations of contact pads of a device to be tested, made according to the prior art.
Figure 2D:
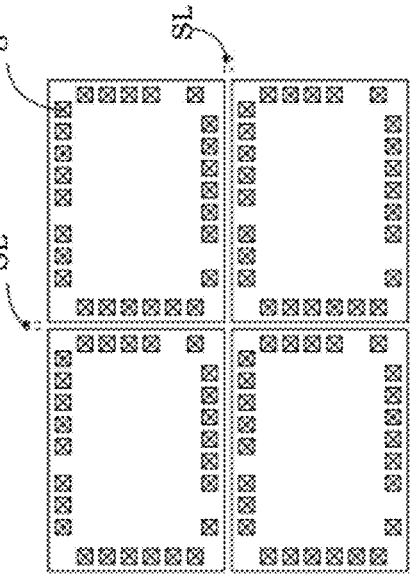
Figure 2A:
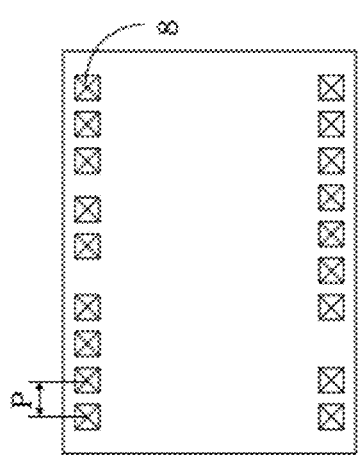
Figure 2C:
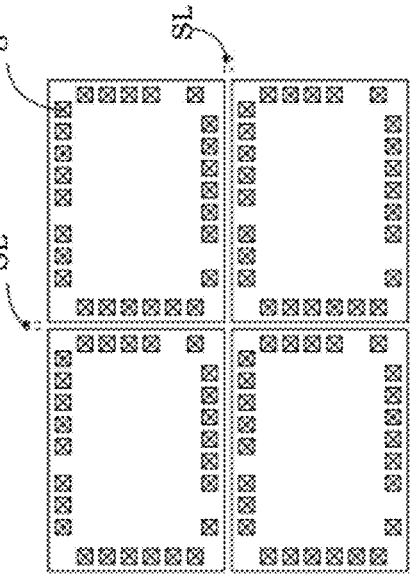
Figure 3A:
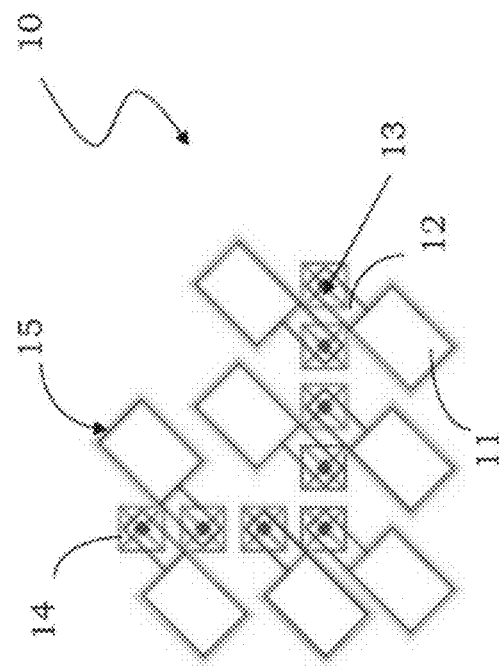
FIGS. 3A and 4A schematically show top views of particular configurations of a plurality of contact probes of a testing head made according to the prior art.
Figure 3B:
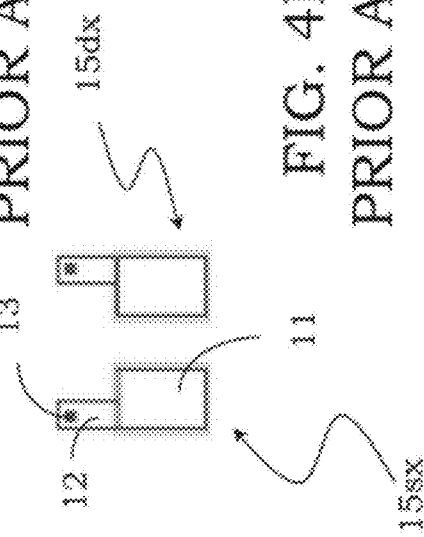
FIGS. 3B and 4B schematically show top views of the contact probes being used in the configurations of FIGS. 3A and 4A, respectively.
Figure 4A:
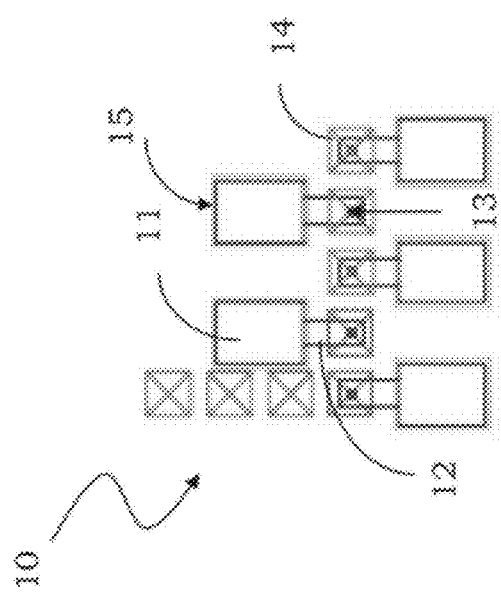
Figure 4B:
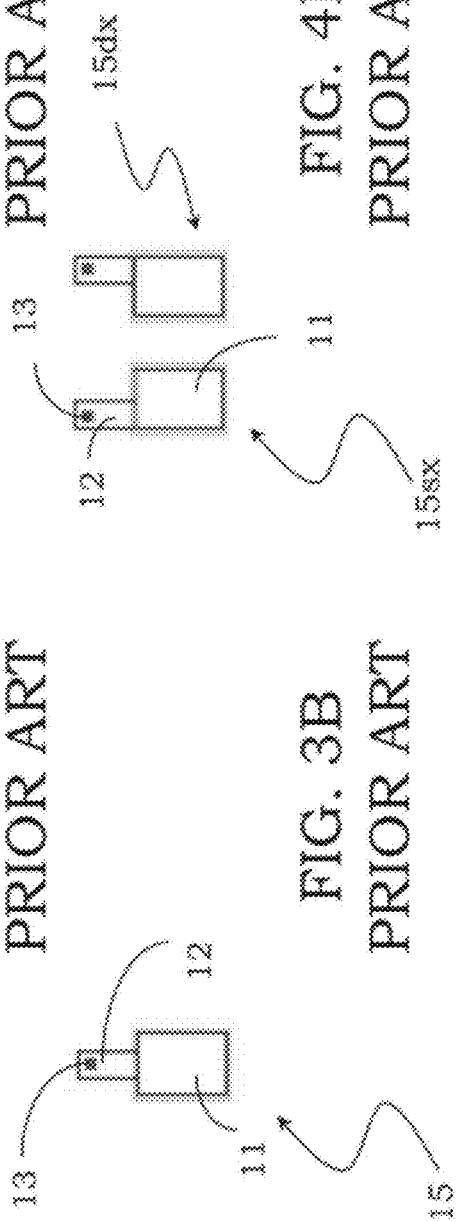
Figure 5A:
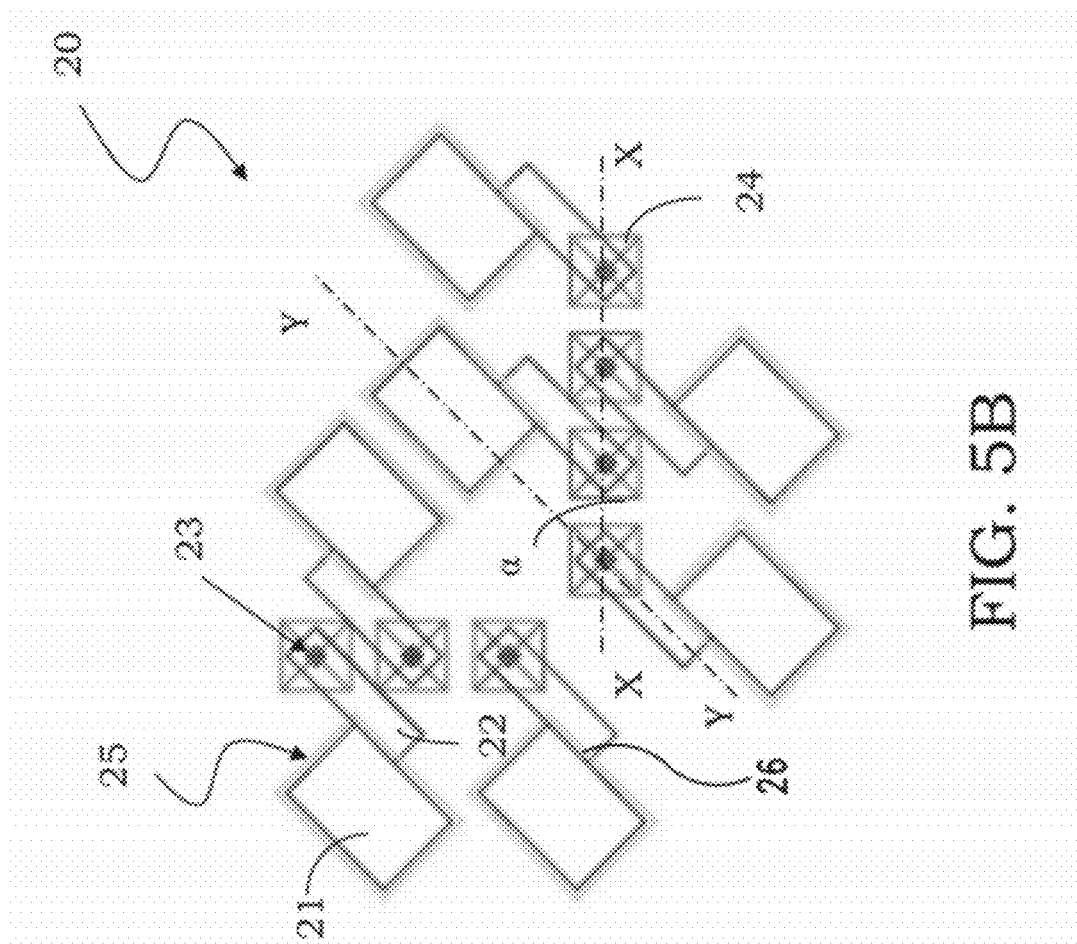
FIG. 5A schematically shows a top view of a contact probe of a testing head of integrated devices, according to a first embodiment of the disclosure.
Figure 5B:
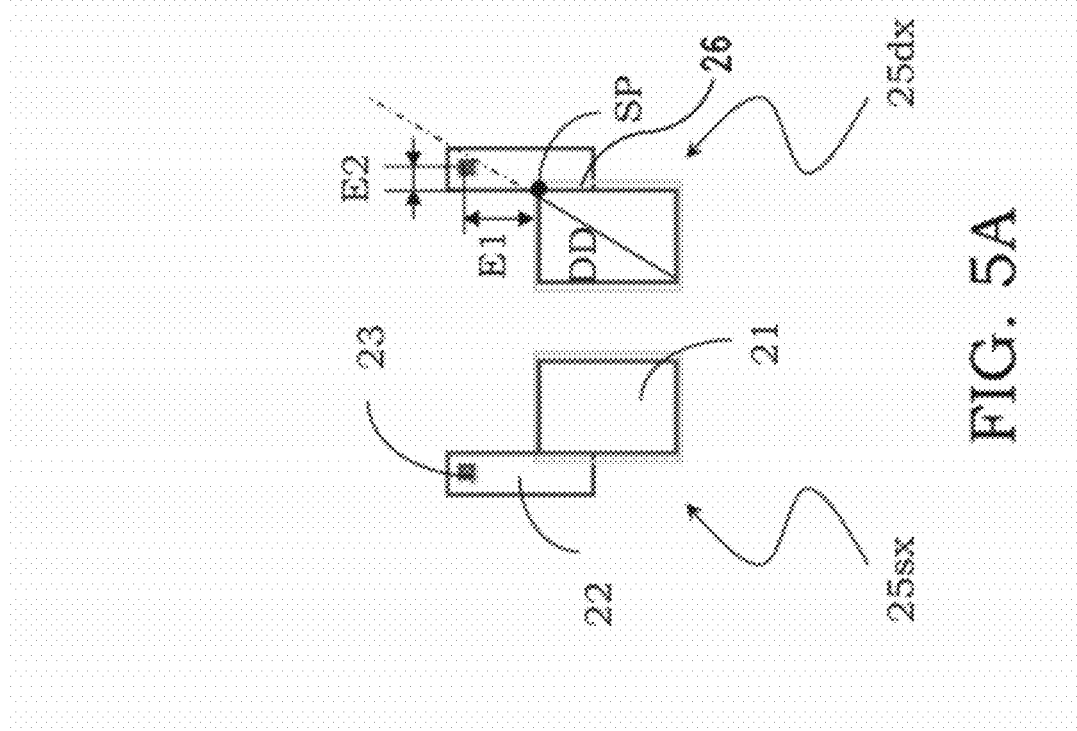
FIG. 5B schematically shows a top view of a configuration of a plurality of probes of the type of FIG. 5A being comprised within the testing head of integrated devices, according to the first embodiment of the disclosure.

With reference to such figures, and in particular to FIGS. 5A and 5B, 20 globally indicates a testing head comprising a plurality of contact probes 25 for testing electronic devices, in particular integrated on a wafer, according to an embodiment of the present disclosure.

It should be noted that the figures show schematic views of the testing head according to the disclosure and are not drawn in scale, but are drawn so as to emphasize the important features of the disclosure.

Moreover, the different aspects of the disclosure shown by way of an example in the figures may of course be combined with one another and are interchangeable from one embodiment to another.

The testing head 20 houses a plurality of contact probes 25 in a manner being totally similar to what described with reference to the prior art, in particular comprising at least one upper guide and one lower guide, provided with respective guide holes wherein the contact probes 25 slide.

According to one aspect of the disclosure, a contact probe 25 comprises a so-called probe body 21 and is provided with a projecting arm 22 that ends with a probe tip 23 for the contact pads 24 of the device to be tested, such probe tip 23 being offset with respect to the probe body 21. In particular, the testing head 20 according to the disclosure houses a plurality of contact probes 25, each having a projecting arm 22 with respect to both walls of a section of the respective probe body 21.

In particular, according to an aspect of the disclosure, the projecting arm 22 is arranged so as to exceed a lateral size of the probe body 21, as is clear from FIG. 5A. In other words, in the top view of FIG. 5A, the shadow of the projecting arm 22 is outside the shadow of the probe body 21.

In a preferred embodiment, the contact probe 25 has a substantially rectangular section and the projecting arm 22 is arranged so as to extend parallel to the extension of one of the sides of such rectangular section, outside the probe body 21. In this way, the probe tip 23 is eccentric and external with respect to the probe body 21, arranged in proximity of the extension of a side thereof, in particular a longer side of the rectangular section thereof. In other words, the projecting arm 22 (and thus the probe tip 23) extends outside the probe body 21 substantially in extension of a direction DD of the rectangular section of such body, as shown in the figure.

The projecting arm 22 has a smaller width than the width of the probe, that is, than a shorter side of the probe body 21 of the respective contact probe 25.

More in particular, for probes having a length which ranges between 10 μm and 300 μm and a width which ranges between 10 μm and 300 μm, the projecting arms have a length which ranges between 1 μm and 300 μm and a width which ranges between 3 μm and 300 μm.

Of course, the above values are only an indication as typical in the field since the same depend on the geometrical layout conditions of the device. A man skilled in the art will be able to adapt them to the single requirements considering that such values strictly depend on the pitch value and on the distance between rows of contiguous device pads (and thus on the thickness of the scribing line separating them). Moreover, a man skilled in the art will be able to keep into account other critical parameters in such sizing, such as the capability of minimizing the walls between contiguous guide holes and the need of leaving a "clearance" between guide hole and probe seated therein.

In the practice it may be said that the testing head 20 according to the disclosure results from the observation that probe bodies side by side to each other better reach the contact pads with the respective probe tips, if at least one probe tip is arranged on an arm projecting from an edge of the respective probe body, so as to have a lug 26 with respect to both faces of the probe body converging into the edge.

In other words, the probe tip 23 is into space, in a position external to the probe body 21, and precisely in a quadrant that is defined by the planes of the two faces converging into the edge, indicated with SP in the figures, opposite the solid material dihedral defined between the faces.

With reference to a testing head defined by the prior art, in particular by the European patent No. EP 1 243 931 to the Applicant, it is noted that the probe tip is external to a face, but enclosed by the U defined by the other faces, whereas for the testing head 20 according to the disclosure, the probe tip 23 is external to two faces, and is enclosed by the L defined by the two remaining faces.

It is therefore noted that the offset of the probe tip 23 can be defined with respect to the two distances from the two respective faces converging into edge SP, indicated with E1 and E2 in FIG. 5A.

It should be noted that the presence of the projecting arm 22 as above described defines as left probes 25*sx* those having a projecting arm 22 placed against a left side of the probe body 21 and right probes 25*dx* as those having a projecting arm 22 placed against a right side of the probe body 21, as shown in FIG. 5A.

The relative terms "right" and "left" are usual in the field and in the present description are used in relation to a local reference system of the figures. Such terms are an aid for the reader to understand the configuration of the contact probes according to the embodiments of the disclosure and should not be intended as in any way limiting of the same.

In this way it is possible to arrange the probes 25 in an alternatively opposed position with respect to the contact pads 24, thus considerably increasing the space available for the probe bodies 21, with consequent reduction of the contact risks also for very small pitches, as schematically shown in FIG. 5B for a testing head 20 according to a first embodiment of the disclosure.

FIG. 5B in particular shows an arrangement of the contact probes 25 being particularly suitable for the case of contact pads 24 arranged on all the four sides of the device to be tested.

In particular, the adjacent probes 25 are arranged in an alternatively opposed position with respect to the contact pads 24 with symmetry axes which slope with respect to an alignment axis of the contact pads 24, forming a predetermined angle with such axis. In one embodiment, the alignment axes of the contact pads and the symmetry axes of the contact probes form an angle comprised between 20° and 60°, and in one preferred embodiment equal to 45°. In the figure, XX indicates the alignment axis of the contact pads 24 and YY indicates the symmetry axis of the contact probes 25, such axes forming an angle α of 45°.

Moreover, suitably according to this embodiment, probes which are opposed with respect to this alignment axis XX of the contact pads 24 for the contact with consecutive pads are of a same type, in particular left probes, and have symmetry axes mounted so as to form angles of 45° and −135° respectively, adjacent probes in a same half-plane as defined by such alignment axis XX, which do not contact consecutive contact pads 24, being mounted with axes forming a same angle. Likewise, the probes which are opposed with respect to the orthogonal axis YY with respect to the alignment of the contact pads 24 for the contact with consecutive pads are of a same type, in particular right probes, and have symmetry axes mounted so as to form angles of 45° and −135° respectively.

"Adjacent" probes are those consecutive according to the distribution direction of the corresponding contact pads 24, as well as those consecutive according to both a longitudinal direction and to a cross direction in the case of a distribution on four sides of the contact pads 24.

It is immediate to see that the distribution of the contact probes 25 of the testing head 20 according to the first embodiment of the disclosure allows the pitch of the contact pads 24 to be contacted to be further reduced since the projecting arms 22 of the probes have a smaller width than the width of the probes 25, in particular of the probe bodies 21, and can therefore be closer to each other without danger of contact.

Figure 6:
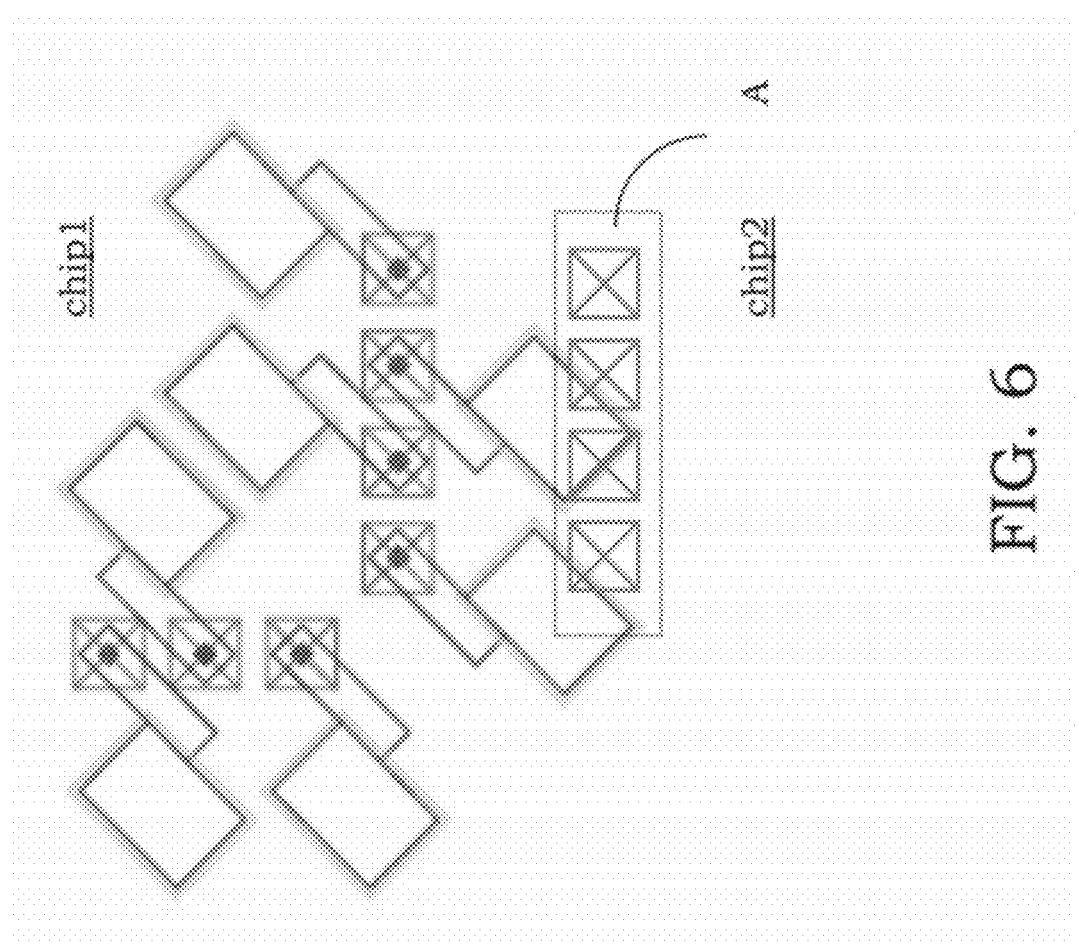
FIG. 6 schematically shows a top view of the configuration of probes of FIG. 5B when testing two contiguous integrated devices.

However, in the case of a distribution on four sides of the contact pads 24, it happens that the testing head 20 according to the first embodiment of the disclosure does not allow multiple adjacent and close chips to be tested, as is the case with the most recent technologies. In this case, in fact, the probe bodies 21 of the contact probes 25 positioned along the contact pads 24 of one side of a first device are above the contact pads 24 of an opposite side of a second device, actually preventing the contact thereof with other probes however they are positioned, as schematically shown in FIG. 6. In the practice, the bodies 21 of the contact probes 25 of a first device, indicated as chip1 in FIG. 6, screen an area A corresponding to further contact pads 24 of a second device, indicated as chip2 in FIG. 6. While it is possible to miniaturize the section of the contact probes used, of course it happens that there is a limit to such miniaturization, as well as to the wall thickness between holes of contiguous probes.

Figure 7B:
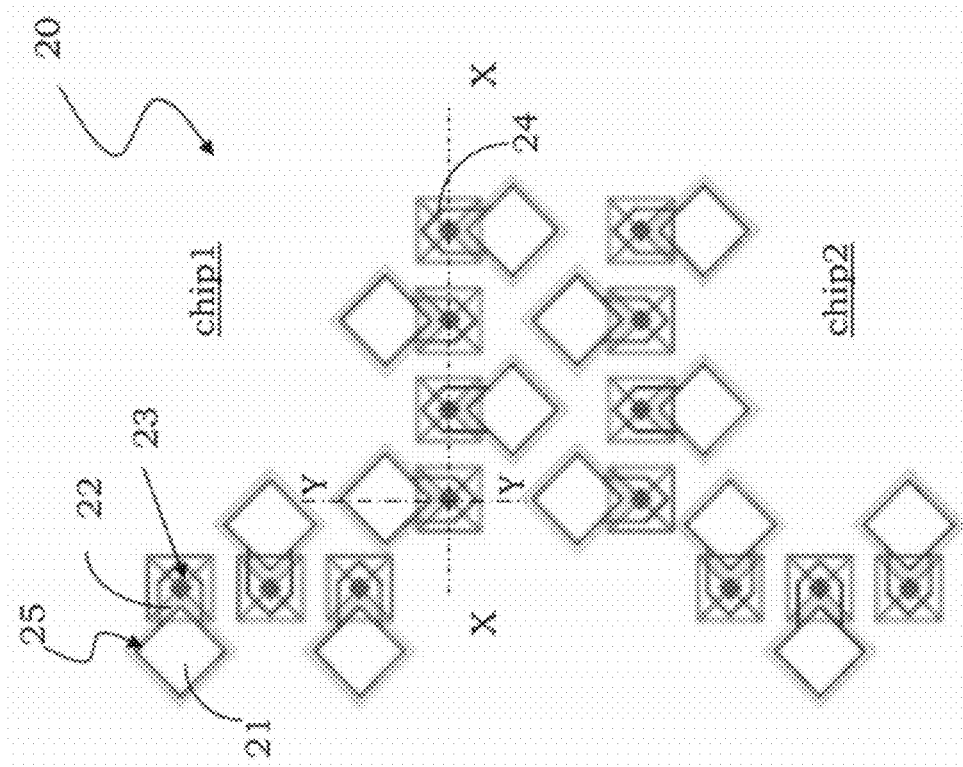
FIG. 7B schematically shows a top view of a configuration of a plurality of probes of the type of FIG. 7A being comprised within the testing head of integrated devices, according to the second embodiment of the disclosure.
Figure 7A:
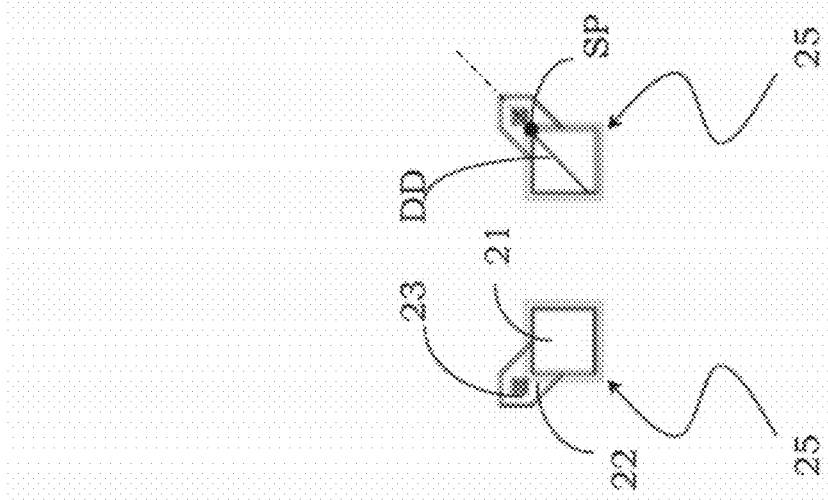
FIG. 7A schematically shows a top view of a contact probe of a testing head of integrated devices, according to a second embodiment of the disclosure.

A second embodiment of the testing head 20 according to the disclosure is shown in FIG. 7A. As shall be explained in the following description, the testing head 20 according to this second embodiment allows the concurrent testing of multiple adjacent devices, even close to each other, to be carried out.

According to one aspect of the disclosure, a contact probe 25 comprises a probe body 21 with a substantially square section, such as to reduce the size of the same body and allow the testing of two adjacent devices by the testing head 20, as schematically shown in FIG. 7B in the case of a first and a second device indicated as chip1 and chip2 in the figure. What described in relation to the concurrent testing of the two devices chip1 and chip2 may of course be extended also to the case of other devices, for example next to said chip1 and chip2 and with contact pads 24 facing thereto according to the vertical alignment line of the contact pads 24, using the local reference of FIG. 7A.

In particular, each contact probe 25 is also in this case provided with a projecting arm 22 that ends with a probe tip 23 for the contact pads 24 of the device to be tested, such probe tip 23 being offset with respect to the probe body 21. The projecting arm 22 is arranged substantially as an extension of the diagonal DD of the square section of the probe body 21, so as to exceed with respect to the lateral size of such probe body 21, as is clear from FIG. 7A.

More in particular, according to this embodiment, the arm 22 projects from an edge SP of the probe body 21 having a substantially square section, in substantial extension of the diagonal DD of the section of the probe body 21.

It should be noted that according to this embodiment, thanks to the reduction of the probe body size, in particular of the length thereof, it is possible to use projecting arms 22 of limited length, in particular shorter than the length of the projecting arms 22 of the testing head 20 according to the first embodiment of the disclosure shown in FIGS. 5A and 5B.

More in particular, for probes having square sections with a side ranging between 10 μm and 300 μm, the projecting arms have a length which ranges between 1 μm and 300 μm and a width which ranges between 3 μm and 300 μm.

In this case, the probes 25 are all the same, with an arm 22 projecting at 45° from an edge SP of the probe body 21, and they are simply rotated by 90°, as shown in FIG. 7A. A considerable advantage is thus obtained under the construction and industrial viewpoint.

In a preferred embodiment, shown in FIG. 7B, the contact probes 25 are arranged in alternatively opposed positions in the half-planes defined by an alignment axis XX of the contact pads, with the projecting arms 22 having symmetry axes YY parallel to each other according to an orthogonal to the alignment axis XX. More in particular, the contact probes 25 of the adjacent contact pads 24 of two different devices, in particular chip1 and chip2 of FIG. 7B, have a corresponding distribution, probes aligned according to the orthogonal to the alignment axis XX being equally arranged.

It is thus possible not only directly contacting contact pads 24 even having very small pitches, but also carry out the concurrent testing of adjacent devices.

In conclusion, the testing head according to the embodiments of the disclosure allows a high packing of the contact probes and the testing of even highly nearby contact pad configurations, the limit being given by the width of the projecting arms of the contact probes and not by the size of the same probes, in particular of the probe bodies, as it happens with known devices.

In this way, it is possible to reduce the pitch of the integrated device to be tested, that is, move the centers of the relative contact pads closer, up to the requirements of the most modern integrated circuit integration and design technologies.

Moreover, the testing head according to the second embodiment of the disclosure allows the concurrent testing of adjacent devices, even close to each other, to be carried out.

From the foregoing it will be appreciated that, although specific embodiments of the disclosure have been described herein for purposes of illustration, various modifications may be made without deviating from the spirit and scope of the disclosure.

The various embodiments described above can be combined to provide further embodiments. These and other changes can be made to the embodiments in light of the above-detailed description. In general, in the following claims, the terms used should not be construed to limit the claims to the specific embodiments disclosed in the specification and the claims, but should be construed to include all possible embodiments along with the full scope of equivalents to which such claims are entitled. Accordingly, the claims are not limited by the disclosure.

The invention claimed is:

1. A testing head for a test equipment of electronic devices comprising:
   an upper guide and a lower guide separated from one another by an air zone and provided with respective guide holes; and
   a plurality of contact probes inserted into the guide holes, each of the contact probes in turn including:
      a probe body having a substantially rectangular section defined by a first pair of faces parallel to each other and a second pair of faces parallel to each other, each face of the first pair being perpendicular to the faces of the second pair;
      a projecting arm projecting from the probe body;
      a probe tip as an ending portion of the projecting arm for contacting one of a plurality of contact pads of a device to be tested,
   wherein the projecting arm projects outside the probe body so as to have:
      a lug with respect to the first and second pairs of faces of the probe body, and
      a tip defined by two perpendicular faces converging in an edge of the section of the probe body and being the probe tip, the probe tip being offset and external with respect to the probe body.

2. The testing head of claim 1, wherein the projecting arm extends from the edge of the section of the probe body as a substantial extension of a diagonal of the section of the probe body so as to exceed with respect to a lateral size of the probe body.

3. The testing head of claim 1, wherein the projecting arm extends from the edge of the section of the probe body in a parallel manner with respect to the extension of one of the sides of the section, outside the probe body, the probe tip being positioned in proximity of the extension.

4. The testing head of claim 1, wherein the projecting arm has a width being lower than a width of the probe body of the contact probe.

5. The testing head of claim 1, wherein the contact probes are disposed in alternatively opposed positions with respect to an alignment axis of the contact pads of the device to be tested, the contact probes having symmetry axes which slope with respect to the alignment axis.

6. The testing head of claim 5, wherein the alignment axes of the contact pads and the symmetry axes of the contact probes form an angle comprised between 20° and 60°.

7. The testing head of claim 5, wherein:
   contact probes, which are opposed with respect to the alignment axis of the contact pads and in contact with consecutive pads, have projecting arms disposed diametrically opposed with respect to the alignment axis, and
   contact probes, which are adjacent in a same half-plane being defined by the alignment axis, have projecting arms disposed in corresponding positions with respect to the alignment axis.

8. The testing head of claim 1, wherein the contact probes have a substantially squared section, and the projecting arm of each contact probe projects from an edge of the probe body of the contact probe as a substantial extension of a diagonal of its section.

9. The testing head of claim 8, wherein the contact probes are disposed in alternatively opposed positions with respect to an alignment axis of the contact pads of the device to be tested, the projecting arms having symmetry axes which are parallel one another according to an orthogonal of the alignment axis.

10. The testing head of claim 1, wherein the contact probes have a length which ranges between 10 μm and 300 μm and a width which ranges between 10 μm and 300 μm, and the projecting arms have a length which ranges between 1 μm and 300 μm and a width which ranges between 3 μm and 300 μm.

11. A testing head for a test equipment of electronic devices comprising:
   an upper guide and a lower guide separated from one another by an air zone and provided with respective guide holes; and
   a plurality of contact probes inserted into the guide holes, each of the contact probes in turn including at least a probe body having a substantially rectangular section and a projecting arm from the probe body which ends with a probe tip for contacting one of a plurality of contact pads of a device to be tested, wherein:
      the projecting arm projects outside the probe body so as to have a lug with respect to first and second faces of said probe body, which faces converge in an edge, and the contact probes are disposed in alternatively opposed positions with respect to an alignment axis of the contact pads of the device to be tested, the contact probes having symmetry axes which slope with respect to the alignment axis.

12. The testing head of claim 11, wherein the projecting arm extends from the edge of the section of the probe body as a substantial extension of a diagonal of the section of the probe body so as to exceed with respect to a lateral size of the probe body.

13. The testing head of claim 11, wherein the projecting arm extends from the edge of the section of the probe body in a parallel manner with respect to the extension of one of the sides of the section, outside the probe body, the probe tip being positioned in proximity of the extension.

14. The testing head of claim 11, wherein the projecting arm has a width being lower than a width of the probe body of the contact probe.

15. The testing head of claim 11, wherein the alignment axes of the contact pads and the symmetry axes of the contact probes form an angle comprised between 20° and 60°, preferably equal to 45°.

16. The testing head of claim 11, wherein:
contact probes, which are opposed with respect to the alignment axis of the contact pads and in contact with consecutive pads, have projecting arms disposed diametrically opposed with respect to the alignment axis, and
contact probes, which are adjacent in a same half-plane defined by the alignment axis, have projecting arms disposed in corresponding positions with respect to the alignment axis.

17. The testing head of claim 11, wherein the contact probes have a substantially squared section, each comprising a projecting arm from an edge of the probe body as a substantial extension of a diagonal of its section.

18. The testing head of claim 17, wherein the contact probes are disposed in alternatively opposed positions with respect to an alignment axis of the contact pads of the device to be tested, the projecting arms having symmetry axes which are parallel one another according to an orthogonal of the alignment axis.

19. The testing head of claim 11, wherein the contact probes have a length which ranges between 10 μm and 300 μm and a width which ranges between 10 μm and 300 μm, and the projecting arms have a length which ranges between 1 μm and 300 μm and a width which ranges between 3 μm and 300 μm.

20. A testing head for a test equipment of electronic devices comprising:
an upper guide and a lower guide separated from one another by an air zone and provided with respective guide holes; and
a plurality of contact probes inserted into the guide holes, each of the contact probes in turn including at least a probe body having a substantially rectangular section and a projecting arm from the probe body which ends with a probe tip for contacting one of a plurality of contact pads of a device to be tested, wherein:
the projecting arm projects outside the probe body so as to have a lug with respect to first and second faces of said probe body, which faces converge in an edge,
the contact probes are disposed in alternatively opposed positions with respect to an alignment axis of the contact pads of the device to be tested, the contact probes having symmetry axes which slope with respect to the alignment axis,
the contact probes include first contact probes, which are opposed with respect to the alignment axis of the contact pads, are in contact with consecutive pads, and have projecting arms disposed diametrically opposed with respect to the alignment axis, and
the contact probes include second contact probes, which are adjacent in a same half-plane being defined by the alignment axis, have projecting arms disposed in corresponding positions with respect to the alignment axis.

21. The testing head of claim 20, wherein the projecting arm extends from the edge of the section of the probe body as a substantial extension of a diagonal of the section of the probe body so as to exceed with respect to a lateral size of the probe body.

22. The testing head of claim 20, wherein the projecting arm extends from the edge of the section of the probe body in a parallel manner with respect to the extension of one of the sides of the section, outside the probe body, the probe tip being positioned in proximity of the extension.

23. The testing head of claim 20, wherein the projecting arm has a width lower than a width of the probe body of the contact probe.

24. The testing head of claim 20, wherein the alignment axes of the contact pads and the symmetry axes of the contact probes form an angle comprised between 20° and 60°.

25. The testing head of claim 20, wherein the contact probes have a substantially squared section, each comprising a projecting arm from an edge of the probe body as a substantial extension of a diagonal of its section.

26. The testing head of claim 25, wherein the contact probes are disposed in alternatively opposed positions with respect to an alignment axis of the contact pads of the device to be tested, the projecting arms having symmetry axes which are parallel one another according to an orthogonal of the alignment axis.

27. The testing head of claim 20, wherein the contact probes have a length which ranges between 10 μm and 300 μm and a width which ranges between 10 μm and 300 μm, and the projecting arms have a length which ranges between 1 μm and 300 μm and a width which ranges between 3 μm and 300 μm.

28. A test equipment of electronic devices comprising:
a testing head having an upper guide and a lower guide separated from one another by an air zone and provided with respective guide holes; and a plurality of contact probes inserted into the guide holes; and
a device to be tested comprising a plurality of contact pads,
each of the contact probes in turn including at least a probe body having a substantially rectangular section and a projecting arm projecting from the probe body which ends with a probe tip for contacting one of a plurality of contact pads of the device to be tested,
wherein the projecting arm of each contact probe projects outside the respective probe body so as to have a lug with respect to first and second faces of said probe body, which faces converge in an edge defining a probe tip offset and external with respect to the probe body.

29. The test equipment of claim 28, wherein the contact probes of the testing head are disposed in alternatively opposed positions with respect to an alignment axis of the contact pads of the device to be tested, the contact probes having symmetry axes which slope with respect to the alignment axis.

30. The test equipment of claim 28, wherein the alignment axes of the contact pads of the device to be tested and the symmetry axes of the contact probes of the testing head form an angle comprised between 20° and 60°.

31. The test equipment of claim 28, wherein:

contact probes of the testing head, which are opposed with respect to the alignment axis of the contact pads of the device to be tested and in contact with consecutive pads of the device to be tested, have projecting arms disposed diametrically opposed with respect to the alignment axis, and contact probes of the testing head, which are adjacent in a same half-plane being defined by the alignment axis of the contact pads of the device to be tested, have projecting arms disposed in corresponding positions with respect to the alignment axis.

32. The test equipment of claim 28, wherein the contact probes of the testing head have a substantially squared section, each comprising a projecting arm from an edge of the probe body as a substantial extension of a diagonal of its section.

33. The test equipment of claim 32, wherein the contact probes of the testing head are disposed in alternatively opposed positions with respect to an alignment axis of the contact pads of the device to be tested, the projecting arms having symmetry axes which are parallel one another according to an orthogonal of the alignment axis.

* * * * *